US011211559B2

United States Patent
Forrest et al.

(10) Patent No.: US 11,211,559 B2
(45) Date of Patent: Dec. 28, 2021

(54) MATERIALS FOR CONTROLLING THE EPITAXIAL GROWTH OF PHOTOACTIVE LAYERS IN PHOTOVOLTAIC DEVICES

(75) Inventors: Stephen R. Forrest, Ann Arbor, MI (US); Brian E. Lassiter, Ypsilanti, MI (US); Jun Y. Lee, Seongnam-si (KR); Kyoung S. Yook, Yongin-si (KR); Soon O. Jeon, Seoul (KR); Byung D. Chin, Seongnam-si (KR)

(73) Assignees: The Regents of the University of Michigan, Ann Arbor, MI (US); Industry-Academic Cooperation Foundation Dankook University, Guepmgoo (KR)

( * ) Notice: Subject to any disclaimer, the term of this patent is extended or adjusted under 35 U.S.C. 154(b) by 0 days.

(21) Appl. No.: 13/273,753

(22) Filed: Oct. 14, 2011

(65) Prior Publication Data
US 2012/0090685 A1    Apr. 19, 2012

Related U.S. Application Data

(60) Provisional application No. 61/393,732, filed on Oct. 15, 2010.

(51) Int. Cl.
*H01L 51/44*    (2006.01)
*H01L 51/00*    (2006.01)
(Continued)

(52) U.S. Cl.
CPC .......... *H01L 51/0012* (2013.01); *B82Y 10/00* (2013.01); *H01L 51/001* (2013.01);
(Continued)

(58) Field of Classification Search
CPC ............... H01L 51/0012; H01L 51/424; H01L 51/4246; H01L 51/4253; H01L 51/0072
See application file for complete search history.

(56) References Cited

U.S. PATENT DOCUMENTS 4,222,903 A * 9/1980 Heeger .................. H01B 1/125
                                                    252/500
5,849,403 A * 12/1998 Aoki ................... H01L 51/0508
                                                    252/589
(Continued)

FOREIGN PATENT DOCUMENTS

WO    WO 2009-084078    7/2009

OTHER PUBLICATIONS

Hadipour, Afshin et al.; Solution-Processed Organic Tandem Solar cells; Aug. 28, 2006; Advanced Functional Materials; 16; pp. 1897-1903.*

(Continued)

*Primary Examiner* — Edward J. Schmiedel
(74) *Attorney, Agent, or Firm* — Finnegan, Henderson, Farabow, Garrett & Dunner LLP

(57) ABSTRACT

There is disclosed ultrathin film material templating layers that force the morphology of subsequently grown electrically active thin films have been found to increase the performance of small molecule organic photovoltaic (OPV) cells. There is disclosed electron-transporting material, such as hexaazatriphenylene-hexacarbonitrile (HAT-CN) can be used as a templating material that forces donor materials, such as copper phthalocyanine (CuPc) to assume a vertical-standing morphology when deposited onto its surface on an electrode, such as an indium tin oxide (ITO) electrode. It has been shown that for a device with HAT-CN as the templating buffer layer, the fill factor and short circuit current of CuPc:C60 OPVs were both improved compared with cells lacking the HAT-CN template. This is explained by the reduction of the series resistance due to the improved crystallinity of CuPc grown onto the ITO surface.

22 Claims, 13 Drawing Sheets

(51) Int. Cl.
  *B82Y 10/00*  (2011.01)
  *H01L 51/42*  (2006.01)
(52) U.S. Cl.
  CPC ...... *H01L 51/0046* (2013.01); *H01L 51/0072* (2013.01); *H01L 51/424* (2013.01); *H01L 51/4246* (2013.01); *H01L 51/4253* (2013.01); *Y02E 10/549* (2013.01); *Y02P 70/50* (2015.11)

(56) References Cited

U.S. PATENT DOCUMENTS

| | | | | |
|---|---|---|---|---|
| 2002/0017612 | A1* | 2/2002 | Yu | B82Y 10/00 250/370.11 |
| 2003/0087064 | A1* | 5/2003 | Sakurai | G02F 1/15 428/161 |
| 2004/0113546 | A1* | 6/2004 | Forrest et al. | 313/504 |
| 2004/0124432 | A1* | 7/2004 | Ko | H01L 51/5281 257/99 |
| 2004/0168718 | A1* | 9/2004 | Nelles et al. | 136/263 |
| 2005/0098726 | A1* | 5/2005 | Peumans | B82Y 10/00 250/338.1 |
| 2006/0043372 | A1* | 3/2006 | Qiu | H01L 51/5212 257/72 |
| 2006/0134457 | A1* | 6/2006 | Baldacchini | C09K 11/06 428/690 |
| 2009/0308456 | A1* | 12/2009 | Rand et al. | 136/261 |
| 2010/0263727 | A1 | 10/2010 | Oyamada | |

OTHER PUBLICATIONS

Kim, Jong Soo et al.; Poly(r-hexylthiophene) Nanorods with Aligned Chain Orientation for Organic Photovoltaics; Jan. 11, 2010; Advanced Functional Materialsl; 20; pp. 540-545.*

Aryal, Mukti et al.; Nano-Confinement Induced Chain Alignment in Ordered P3HT Nanostructures Defined by Nanoimprint Lithography; American Chemical Society Nano (ACSNANO); vol. 3, No. 10; pp. 3085-3090.*

Yang, Fan et al.; Controlled growth of a molecular bulk heterojunction photovoltaic device; Nature; published online Dec. 12, 2004; http://www.nature.com/nmat/journal/v4/n1/pdf/nmat1285.pdf.*

Seed—Definition of Seed by Merriam-Webster; Merriam Webster; http://www.merriam-webster.com/dictionary/seed; accessed and printed Apr. 24, 2015.*

Springe rMaterials TTF:TCNQ; tetrathiafulvalene:tetracyanoquinodimethane;Landolt-Börnstein—Group III Condensed Matter 41E; (Ternary Compounds, Organic Semiconductors) (Year: 2000).*

7,7,8,8-tetracyanoquinodimethane; Sigma-Aldrich; p. 1; (Year: 2017).*

2,3,5,6-tetrafluoro-7,7,8,8-tetracyanoquinodimethane; Sigma-Aldrich; p. 1; http://www.sigmaaldrich.com/catalog/product/aldrich/376779?lang=en&region=US (Year: 2017).*

Tetrathiafulvalene 7,7,8,8-tetracyanoquinodimethane; Sigma-Aldrich; pp. 1; http://www.sigmaaldrich.com/catalog/product/sial/90548?lang=en&region=US&cm_sp=Insite-_-prodRecCold_xviews-_-prodRecCold10-1 (Year: 2017).*

Malliaras, G.G. et al.; Photovoltaic measurement of the built-in potential in organic light emitting diodes and photodiodes; J. Appl. Phys., vol. 84, No. 3, Aug. 1, 1998; pp. 1583-1587 (Year: 1998).*

Liao, Liang-Sheng et al.; Tandem Organic Light-Emitting Diode using Hexaazatriphenylene Hexacarbonitrile in the Intermediate Connector; Adv. Mater.; 2008, 20, p. 324-329 (Year: 2008).*

Falkenberg, Christiane et al.; The role of energy level matching in organic solar cells-hexaazatriphenylene hexacarbonitrile as transparent electron transport material; Solar Energy Materials & Solar Cells (2011) 927-932; available online Dec. 9, 2010 (Year: 2010).*

Aryal M. et al., "Imprinted large-scale high density polymer nanopillars for organic solar cells," Journal of Vacuum Science and Technology: Part B, 2008, pp. 2562-2566, vol. 26, No. 6.

Hirade M. et al., "Formation of organic crystalline nanopillar arrays and their application to organic photovoltaic cells," ACS Applied Materials & Interfaces, 2010, pp. 80-83, vol. 3, No. 1.

International Search Report dated Jan. 17, 2012, in Application No. PCT/US2011/056347.

Kyoung S. Y. et al., "Vertical orientation of copper phthalocyanine in organic solar cells using a small molecular weight organic templating layer," Applied Physics Letters, American Institute of Physics, 2011, pp. 43308-43308, vol. 99, No. 4.

Sakurai T. et al., "Growth process of phthalocyanine films deposited on 3,4,9,10-perylene tetracarboxylic dianhydride template layers," Japanese Journal of Applied Physics, Japan Society of Applied Physics, 2006, pp. 255-259, vol. 45, No. 1A.

* cited by examiner

(bottom to top) ITO / HAT-CN / CuPc (25 nm) / CuPc:C60 (1:1, 10 nm) / C60 (35 nm) / BCP (15 nm) / Ca / HAT-CN / CuPc (25 nm) / CuPc:C60 (1:1, 10 nm) / C60 (35 nm) / BCP (15 nm) / Al (100 nm)

FIG. 4D

(bottom to top) ITO / HAT-CN / CuPc (25 nm) / CuPc:C60 (1:1, 10 nm) / C60 (35 nm) / BCP (15 nm) / Ca / Al or Ag / HAT-CN / CuPc (25 nm) / CuPc:C60 (1:1, 10 nm) / C60 (35 nm) / BCP (15 nm) / Al (100 nm)

FIG. 4E

(bottom to top) ITO / HAT-CN / CuPc (25 nm) / CuPc:C60 (1:1, 10 nm) / C60 (35 nm) / BCP:Cs (15 nm) / HAT-CN / CuPc (25 nm) / CuPc:C60 (1:1, 10 nm) / C60 (35 nm) / BCP (15 nm) / Al (100 nm)

MATERIALS FOR CONTROLLING THE EPITAXIAL GROWTH OF PHOTOACTIVE LAYERS IN PHOTOVOLTAIC DEVICES

CROSS-REFERENCE TO RELATED APPLICATIONS

This application claims the benefit of U.S. Provisional Application No. 61/393,732, filed Oct. 15, 2010, which is incorporated herein by reference in its entirety.

STATEMENT REGARDING FEDERALLY SPONSORED RESEARCH

This invention was made with U.S. Government support under Contract No. DE-SC00000957 awarded by the Department of Energy. The government has certain rights to this invention.

JOINT RESEARCH AGREEMENT

The subject matter of this application was made by, on behalf of, and/or in connection with one or more of the following parties to a joint university-corporation research agreement: University of Michigan, Dankook University, and Global Photonic Energy Corporation. The agreement was in effect on and before the date the invention was made, and the claimed invention was made as a result of activities undertaken within the scope of the agreement.

FIELD

The present disclosure generally relates to photosensitive devices, such as organic solar cells. More specifically, it is directed to photosensitive devices comprising organic seed layers, such as preferentially hole conducting organic seed layers that allow the resulting device to exhibit an increased crystallinity when compared to the device without the preferentially hole conducting organic seed layer.

BACKGROUND

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Solar cells, also called photovoltaic (PV) devices, are a type of photosensitive optoelectronic device that is specifically used to generate electrical power. PV devices, which may generate electrical energy from light sources other than sunlight, can be used to drive power consuming loads to provide, for example, lighting, heating, or to power electronic circuitry or devices such as calculators, radios, computers or remote monitoring or communications equipment. These power generation applications also often involve the charging of batteries or other energy storage devices so that operation may continue when direct illumination from the sun or other light sources is not available, or to balance the power output of the PV device with a specific application's requirements. As used herein the term "resistive load" refers to any power consuming or storing circuit, device, equipment or system.

Another type of photosensitive optoelectronic device is a photoconductor cell. In this function, signal detection circuitry monitors the resistance of the device to detect changes due to the absorption of light.

Another type of photosensitive optoelectronic device is a photodetector. In operation a photodetector is used in conjunction with a current detecting circuit which measures the current generated when the photodetector is exposed to electromagnetic radiation and may have an applied bias voltage. A detecting circuit as described herein is capable of providing a bias voltage to a photodetector and measuring the electronic response of the photodetector to electromagnetic radiation.

These three classes of photosensitive optoelectronic devices may be characterized according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias. As a general rule, a photovoltaic cell provides power to a circuit, device or equipment, but does not provide a signal or current to control detection circuitry, or the output of information from the detection circuitry. In contrast, a photodetector or photoconductor provides a signal or current to control detection circuitry, or the output of information from the detection circuitry but does not provide power to the circuitry, device or equipment.

Traditionally, photosensitive optoelectronic devices have been constructed of a number of inorganic semiconductors, e.g., crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

PV devices may be characterized by the efficiency with which they can convert incident solar power to useful electric power. Devices utilizing crystalline or amorphous silicon dominate commercial applications, and some have achieved efficiencies of 23% or greater. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. Present commercially available amorphous silicon cells have stabilized efficiencies between 4 and 8%.

PV devices may be optimized for maximum electrical power generation under standard illumination conditions (i.e., Standard Test Conditions which are 1000 W/m$^2$, AM1.5 spectral illumination), for the maximum product of photocurrent times photovoltage. The power conversion efficiency of such a cell under standard illumination conditions depends on the following three parameters: (1) the current under zero bias, i.e., the short-circuit current $I_{SC}$, in Amperes (2) the photovoltage under open circuit conditions, i.e., the open circuit voltage $V_{OC}$, in Volts and (3) the fill factor, ff.

PV devices produce a photo-generated current when they are connected across a load and are irradiated by light. When irradiated under infinite load, a PV device generates its maximum possible voltage, V open-circuit, or $V_{OC}$. When irradiated with its electrical contacts shorted, a PV device generates its maximum possible current, I short-circuit, or $I_{SC}$. When actually used to generate power, a PV device is connected to a finite resistive load and the power output is given by the product of the current and voltage, I×V. The maximum total power generated by a PV device is inherently incapable of exceeding the product, $I_{SC} \times V_{OC}$. When the load value is optimized for maximum power extraction, the current and voltage have the values, $I_{max}$ and $V_{max}$, respectively.

A figure of merit for PV devices is the fill factor, ff, defined as:

$$ff=\{I_{max}V_{max}\}/\{I_{SC}V_{OC}\} \qquad (1)$$

where ff is always less than 1, as $I_{SC}$ and $V_{OC}$ are never obtained simultaneously in actual use. Nonetheless, as ff approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, $\eta_P$, may be calculated by:

$$\eta_P = f\!f^*(I_{SC}^*V_{OC})/P_{inc}$$

To produce internally generated electric fields that occupy a substantial volume of the semiconductor, the usual method is to juxtapose two layers of material with appropriately selected conductive properties, especially with respect to their distribution of molecular quantum energy states. The interface of these two materials is called a photovoltaic junction. In traditional semiconductor theory, materials for forming PV junctions have been denoted as generally being of either n or p type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photo-generated, majority carrier concentration depends primarily on unintentional doping by defects or impurities. The type and concentration of impurities determine the value of the Fermi energy, or level, within the gap between the conduction band minimum and valance band maximum energies. The Fermi energy characterizes the statistical occupation of molecular quantum energy states denoted by the value of energy for which the probability of occupation is equal to ½. A Fermi energy near the conduction band minimum energy indicates that electrons are the predominant carrier. A Fermi energy near the valence band maximum energy indicates that holes are the predominant carrier. Accordingly, the Fermi energy is a primary characterizing property of traditional semiconductors and the prototypical PV junction has traditionally been the p-n interface.

The term "rectifying" denotes, inter alia, that an interface has an asymmetric conduction characteristic, i.e., the interface supports electronic charge transport preferably in one direction. Rectification is associated normally with a built-in electric field which occurs at the junction between appropriately selected materials.

Conventional inorganic semiconductor PV cells employ a p-n junction to establish an internal field. High-efficiency PV devices are typically produced on expensive, single crystal growth substrates. These growth substrates may include single crystal wafers, which can be used for creating a perfect lattice and structural support for the expitaxial growth of active layers, also known as "epilayers." These epilayers may be integrated into PV devices with their original growth substrates intact. Alternatively, those epilayers may be removed and recombined with a host substrate. Photodetectors and PV cells using small molecular weight organic thin films deposited on substrates have the potential advantages of being low-cost and lightweight. In addition, because the exciton diffusion length is small compared to the thickness required for complete absorption of light (on the order of hundreds of angstroms versus thousands of angstroms), thin films may allow for a more efficient power generation. Accordingly, there exists a need to further develop and improve the efficiency photovoltaic devices comprising organic materials.

Previously, 1,4,5,8,9,11-hexaazatriphenylene-hexacarbonitrile (HAT-CN) has been used as a hole charge transporting material in organic electronic devices, such as organic light-emitting diodes. An energy level diagram for the HAT-CN/CuPc/C60 OPV heterojunction is shown in the inset, FIG. 9. The very deep lowest unoccupied molecular orbital (LUMO) is positioned to shuttle electrons between the ITO and CuPc highest occupied MO where they rapidly combine with holes that result from dissociation of excitons at the CuPc/C60 interface. Hence, the HAT-CN provides a potentially low resistance charge injection layer at the anode.

This situation is significantly different than for devices utilizing a PTCDA template, which if sufficiently thick, blocks hole transport due to its significantly lower energy LUMO as compared with HAT-CN. For this reason, HAT-CN is an appropriate choice for a buffer layer deposited on the ITO anode surface.

Unlike previous work, the following disclosure is a departure from past reports of templating of CuPc in that HAT-CN induces an ordered vertical phase in contrast to the more conventional flat-lying orientation observed using strongly binding templates such as PTCDA. Nevertheless, it is apparent that long-range structural ordering induced by templating, whether resulting in either a flat or vertical orientation of the donor molecules, plays a dominant role in improving small molecular weight OPV performance. Hence, it is expected that the HAT-CN template and its analogues may be effective in improving the performance, and possibly the stability, of other small molecule or polymer based OPVs.

SUMMARY

In view of the foregoing, there is disclosed an improved photosensitive device that is made using a templating agent that induces a desired orientation of donor molecules. In particular, there is disclosed a novel combination of templating materials and process conditions that induces an ordered vertical phase of donor molecules.

In one embodiment, there is disclosed a photosensitive device comprising: a first electrode; a second electrode; at least one preferentially hole conducting organic seed layer, such as HAT-CN and its analogues; and at least one cell comprising a first photosensitive layer comprising donor molecules and a second photosensitive layer comprising acceptor molecules, wherein a majority of the donor molecules have a substantially vertical orientation relative to the first electrode.

A method of making the disclosed device is also disclosed. In particular, there is disclosed a method of making a photosensitive device comprising:

depositing at least one preferentially hole conducting organic seed layer over a first electrode;

applying at least one first photosensitive layer over the preferentially hole conducting organic seed layer, wherein the first photosensitive layer comprises donor molecules;

disposing at least one second photosensitive layer over the first photosensitive layer, wherein the second photosensitive layer comprises acceptor molecules; and patterning a second electrode over the second photosensitive layer, wherein a majority of the donor molecules have a substantially vertical orientation relative to the first electrode.

In another embodiment, the disclosed device exhibits one or more of the following characteristics, when compared to the device without the preferentially hole conducting organic seed layer:

increased $V_{oc}$;
increased $I_{SC}$; and
increased fill factor.

The foregoing and other features of the present disclosure will be more readily apparent from the following detailed description of exemplary embodiments, taken in conjunction with the attached drawings. It will be noted that for convenience all illustrations of devices may show the height dimension exaggerated in relation to the width.

BRIEF DESCRIPTION OF THE DRAWINGS

FIGS. 4A-E are schematic drawings of structures, in cross section, illustrating exemplary tandem solar cells comprising HAT-CN seed and recombination layers.

DETAILED DESCRIPTION

Photosensitive devices, such as organic photovoltaic devices, are described herein. The devices described may be used, for example, to generate a usable electrical current from incident electromagnetic radiation (e.g., PV devices) or may be used to detect incident electromagnetic radiation. Some embodiments may comprise at least two electrodes (e.g., anode and cathode) and a cell between the electrodes. The cell may be the portion of the photosensitive device that absorbs electromagnetic radiation to generate excitons that dissociate to produce electrical current.

As used herein, the term "organic" includes polymeric materials as well as small molecule organic materials that may be used to fabricate organic photosensitive devices. "Small molecule" typically refers to an organic material that is not polymeric. Yet, small molecules may include repeat units in some circumstances. For example, using a long chain alkyl group as a substituent does not remove a molecule from the "small molecule" class. Small molecules may also be incorporated into polymers, for example, as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule." In general, a small molecule has a defined chemical formula with a molecular weight that is the same from molecule to molecule, whereas a polymer has a defined chemical formula with a molecular weight that may vary from molecule to molecule. As used herein, "organic" includes metal complexes of hydrocarbyl and heteroatom-substituted hydrocarbyl ligands.

As used herein, the term "layer" refers to a member or component of a photosensitive device whose primary dimension is X-Y, i.e., along its length and width. It should be understood that the term layer is not necessarily limited to single layers or sheets of materials. A layer can comprise laminates or combinations of several sheets of materials. In addition, it should be understood that the surfaces of certain layers, including the interface(s) of such layers with other material(s) or layers(s), may be imperfect, wherein said surfaces represent an interpenetrating, entangled or convoluted network with other material(s) or layer(s). Similarly, it should also be understood that a layer may be discontinuous, such that the continuity of said layer along the X-Y dimension may be disturbed or otherwise interrupted by other layer(s) or material(s).

Figure 1:
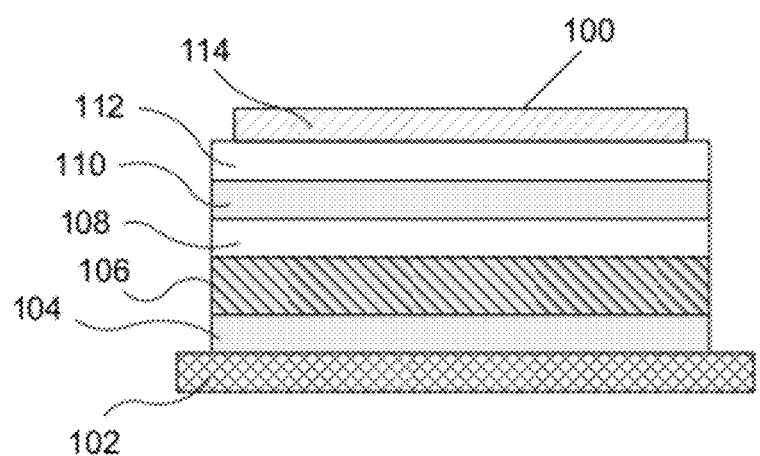
FIG. 1 is a schematic drawing of a structure, in cross-section, illustrating an exemplary photosensitive device comprising an organic seed layer.
Figure 2A:
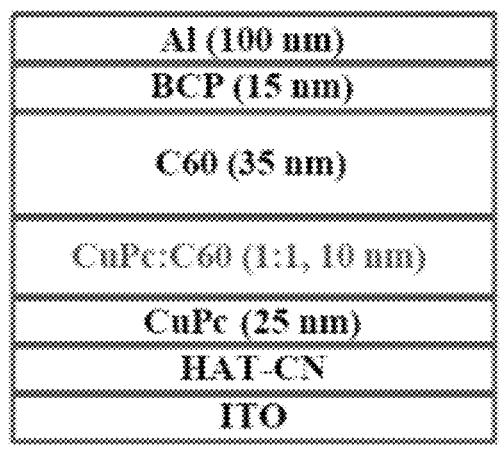
FIG. 2A is a schematic drawing of a structure, in cross-section, illustrating an exemplary organic solar cell comprising a HAT-CN seed layer.
Figure 2B:
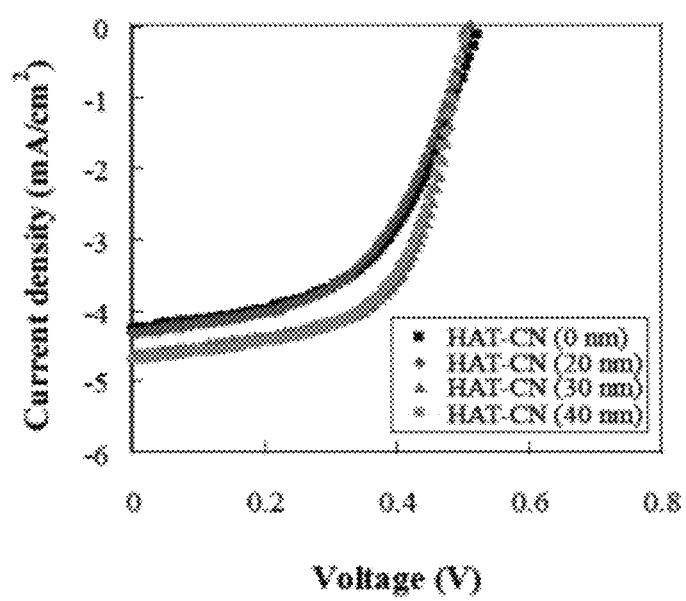
FIG. 2B shows the measured current density versus voltage of the device in FIG. 1A having varying HAT-CN seed layer thicknesses.

The terms "electrode" and "contact" are used herein to refer to a layer that provides a medium for delivering photo-generated current to an external circuit or providing a bias current or voltage to the device. As illustrated in FIG. 1, electrodes 102 and 114 are examples. Electrodes may be composed of metals or "metal substitutes." Herein, the term "metal" is used to embrace both materials composed of an elementally pure metal, and also metal alloys which are materials composed of two or more elementally pure metals. The term "metal substitute" may refer to a material that is not a metal within the normal definition, but which has the metal-like properties such as conductivity, such as doped wide-bandgap semiconductors, degenerate semiconductors, conducting oxides, and conductive polymers. Electrodes may comprise a single layer or multiple layers (a "compound" electrode), may be transparent, semi-transparent, or opaque. Examples of electrodes and electrode materials include those disclosed in U.S. Pat. No. 6,352,777 to Bulovic et al., and U.S. Pat. No. 6,420,031, to Parthasarathy, et al., each incorporated herein by reference in their entireties for all purposes. As used herein, a layer is said to be "transparent" if it transmits at least 50% of the ambient electromagnetic radiation in a relevant wavelength.

The term "cathode" is used in the following manner. In a non-stacked PV device or a single unit of a stacked PV device under ambient irradiation and connected with a resistive load and with no externally applied voltage, e.g., a PV device, electrons move to the cathode from the photo-conducting material. Similarly, the term "anode" is used herein such that in a PV device under illumination, holes move to the anode from the photoconducting material, which is equivalent to electrons moving in the opposite manner. It will be noted that as the terms are used herein, anodes and cathodes may be electrodes or charge transfer layers.

As used herein, "top" means furthest away from the substrate (if present), while "bottom" means closest to the substrate. If the device does not include a base structure, then "top" means furthest away from the first electrode (e.g., bottom electrode). For example, for a device having two electrodes, the bottom electrode is the electrode closest to the substrate, and is generally the first electrode fabricated. The bottom electrode has two surfaces, a bottom side closest to the substrate, and a top side further away from the substrate. Where a first layer is described as disposed, deposited, or applied "over" or "on top of" a second layer, the first layer is disposed further away from the substrate and/or first electrode. There may be other layers between the first and second layer, unless it is specified that the first layer is "in physical contact with" or disposed "directly on" the second layer. For example, a cathode may be described as "disposed over" or "on top of" an anode, even though there are various organic layers in between.

As used herein, the phrase "preferentially hole conducting" means the mobility of holes is higher than that of electrons.

As used herein, the phrase "substantially vertical orientation," represents an orientation relative to the electrode on which it is deposited. For example, it could mean that the donor molecules, such as copper phthalocyanine (CuPc) donor molecules, assume a morphology more perpendicular (or upright) to the electrode on which it is deposited, than not. A majority of the donor molecules assume such an upright position as a result of an ultra-thin templating layer, defined herein as a "preferentially hole conducting organic seed layer," forcing such an orientation.

As used herein, an "ultra-thin templating layer," is defined as a layer less than 75 nm, such as 1 nm or 5 nm increments ranging from greater than 0 to 75 nm. In one embodiment, the templating layer is less than 50 nm, such as 5-40 nm. In one embodiment, the ultra-thin templating layer is 30 nm thick.

FIG. 1 shows photosensitive device 100. The figures are not necessarily drawn to scale. Device 100 may include first electrode 102 and second electrode 114, with at least one cell positioned therebetween. In some embodiments, the cell may comprise first photoactive layer 106 and second photoactive layer 110. Optionally, in some embodiments, the cell may comprise third organic photoactive layer 108 positioned between first photoactive layer 106 and second photoactive layer 110. In some embodiments, device 100 may optionally include a substrate. In some embodiments, the substrate may be positioned below first electrode 102, or above second electrode 114. Further, device 100 may optionally comprise smoothing layers, and/or blocking layers. For example, in some embodiments, blocking layer 112 may be positioned between the cell and second electrode 114. Device 100 may, in at least certain embodiments, be fabricated by depositing the layers described, in order.

The specific arrangement of layers illustrated in FIG. 1 is exemplary only, and is not intended to be limiting. For example, some of the layers (such as blocking layers) may be omitted. Other layers (such as reflective layers or additional acceptor and donor layers) may be added. We define a reflective layer as one which reflects greater than 50% of the incident light. The order of layers may be altered. Arrangements other than those specifically described may be used. Additionally, the photosensitive device may exist as a tandem device comprising one or more additional donor-acceptor layers. A tandem device may have charge transfer layers, electrodes, or charge recombination layers between the tandem donor-acceptor layers.

Suitable substrates may be any substrate that provides desired structural properties. The substrate may be flexible or rigid, planar or non-planar. The substrate may be transparent, translucent or opaque. Exemplary substrates may include rigid plastic, glass and quartz. Flexible plastics and metal foils are examples of flexible substrate materials.

Electrodes 102 and 114 may comprise any suitable material, such as those described above. In some embodiments, electrode 102 may represent an "anode," while electrode 114 represents a "cathode." In some embodiments, electrode 102 may comprise a transparent or semitransparent material. In some embodiments, electrode 102 may comprise a material selected from zinc oxide (ZnO), gallium indium oxide (GIO), indium gallium zinc oxide (IGZO), indium tin oxide (ITO), titanium oxide ($TiO_2$), magnesium oxide (MgO), zinc indium oxide (ZIO), tungsten oxides ($WO_x$), gallium indium tin oxide (GITO), and zinc indium tin oxide (ZITO).

In some embodiments, electrode 102 comprises ITO. In some embodiments, electrode 114 comprises a low work function metal, such as a metal selected from steel, Ni, Ag, Al, Mg, In, and mixtures or alloys thereof. In some embodiments, electrode 114 comprises Al.

As noted above, in some embodiments, electrodes 102 and/or 114 may comprise a compound electrode. For example, electrode 102 may comprise ITO/metal electrode, wherein said metal is selected from Ca, LiF/Al, and Mg:Ag.

As shown in FIG. 1, the cell may be positioned between first electrode 102 and second electrode 114. While the order of the photoactive layers depicted in FIG. 1 should be understood to be purely exemplary, in some embodiments, an optional third photoactive layer 108 may be positioned between the first and second photoactive layers. In some embodiments, layers 106, 108, and 110 may be arranged in a series, such that each of said organic photoactive layers is in direct contact with a next layer in the series. For example, in some embodiments, first organic photoactive layer 106 is in direct contact with second photoactive layer 110. In other embodiments comprising at least one additional photoactive layer, such as third photoactive layer 108, first organic photoactive layer 106 is in direct contact with third photoactive layer 108, and third organic photoactive layer is in direct contact with second organic photoactive layer 110.

The cell, comprising the photoactive layers, represents what may be referred to as a "photoactive region" of device 100, in which light is absorbed to form an excited state, or "exciton", which may subsequently dissociate in to an electron and a hole. The dissociation of the exciton will typically occur at the "heterojunction" formed by the juxtaposition of an acceptor layer and a donor layer. Photosensitive device 100 may comprise a single heterojunction, or what may be referred to as a "dual heterojunction," wherein excitons are dissociated at both interfaces of the third photoactive layer (e.g., dual donor-acceptor layer). For example, charge separation may occur at the heterojunction between first photoactive layer 106 (e.g., donor layer) and third organic layer 108 (e.g., dual donor-acceptor layer). Charge separation may also occur at the heterojunction between third photoactive layer 108 (e.g., dual donor-acceptor) and second photoactive layer 110 (e.g., acceptor layer). The built-in potential at the heterojunctions is determined by the HOMO-LUMO energy level difference between the two materials contacting to form the heterojunction. The HOMO-LUMO gap offset between the donor and acceptor materials produces an electric field at the donor/acceptor interface that facilitates charge separation for excitons created within an exciton diffusion length of the interface.

As alluded to above with respect to the term "layer," it should be understood that the boundaries of photoactive layers 106, 108, and 110, as depicted in FIG. 1, may not be precise, but may be imperfect, discontinuous, and/or otherwise represent an interpenetrating, entangled or convoluted network of donor and acceptor materials (e.g., a mixed and/or bulk heterojunction).

Mixed heterojunctions may be formed, for example, by co-deposition of the donor and acceptor materials using vacuum deposition, vapor-phase deposition, or vacuum thermal evaporation. Bulk heterojunctions may be formed, for example, by controlled growth, co-deposition with post-deposition annealing, or solution processing. Polymer mixed or bulk heterojunctions may be formed, for example, by solution processing of polymer blends of donor and acceptor materials.

In general, planar heterojunctions may have good carrier conduction, but poor exciton dissociation; a mixed layer may have poor carrier conduction and good exciton dissociation, and a bulk heterojunction may have good carrier conduction and good exciton dissociation, but may experience charge build-up at the end of the material "cul-de-sacs," lowering efficiency. Unless otherwise stated, planar, mixed, bulk, and hybrid heterojunctions may be used interchangeably as donor-acceptor heterojunctions throughout the embodiments disclosed herein.

Accordingly, in some embodiments, third photoactive layer 108 may comprise a bulk, mixed, or nanocrystalline donor-acceptor layer disposed between the first photoactive layer 106 and the second photoactive layer 110. In some embodiments, third photoactive layer 108 may include materials that comprise both first photoactive layer 106 and second photoactive layer 110.

Energy levels should be considered when designing a dual heterojunction structure. In order for excitons to dissociate at a heterojunction, the energy offset between the LUMOs and HOMOs of the two materials ($\Delta E_1$ and $\Delta E_2$) should be greater than or equal to half of the exciton binding energy ($E_B$). This may be considered when choosing the materials for the photoactive layers comprising the photoactive region.

In some embodiments, the first, second, and third photoactive layers of device 100 may each comprise different materials with respect to each of the other photoactive layers comprising the cell. In some embodiments, suitable materials for use in photoactive cell may include organometallic compounds, including cyclometallated organometallic compounds. The term "organometallic" as used herein is as generally understood by one of ordinary skill in the art and as given, for example, in Chapter 13 of "Inorganic Chemistry" (2nd Edition) by Gary L. Miessler and Donald A. Tarr, Prentice Hall (1999). Organic layers may be fabricated using vacuum deposition, spin coating, organic vapor-phase deposition (OVPD), inkjet printing, vacuum thermal evaporation (VTE), and other methods known in the art.

In some embodiments, each of the photoactive layers may be selected to comprise complementary absorption spectra. That is, the materials comprising the photoactive layers of the devices described herein may be independently selected from materials that have an absorption spectrum that is complementary to the absorption spectrum of the other photoactive layers, such that a broader range of wavelengths may be harvested from the light source.

In some embodiments, first photoactive layer 106 comprises a donor-type material. In some embodiments, third photoactive layer 108 comprises a dual donor/acceptor-type material. In some embodiments, second photoactive layer 110 comprises an acceptor-type material.

In some embodiments, first photoactive layer 106 comprises a material selected from boron subphthalocyanonine chloride (SubPc), copper phthalocyanine (CuPc), $C_{60}$ and $C_{70}$ fullerenes, chloro-aluminum phthalocyanine (ClAlPc), squarine (SQ), and poly(3-hexylthiophene) (P3HT). In one embodiment, the material comprises CuPc.

In some embodiments, second photoactive layer 110 comprises a material selected from $C_{60}$ and $C_{70}$ fullerenes, 3,4,9,10-perylenetetracarboxylic dianhydride (PTCDA), perfluorinated copper phthalocyanine ($F_{16}$-CuPc), and combinations thereof. In one embodiment, the material comprises $C_{60}$.

In some embodiments, third photoactive layer 108 comprises a material selected from subphthalocyanonine chloride (SubPc), copper phthalocyanine (CuPc), $C_{60}$ and $C_{70}$ fullerenes, chloro-aluminum phthalocyanine (ClAlPc), squarine (SQ), poly(3-hexylthiophene) (P3HT), 3,4,9,10-perylenetetracarboxylic dianhydride (PTCDA), perfluorinated copper phthalocyanine ($F_{16}$-CuPc), and combinations thereof. In one embodiment, the material comprises CuPc:$C_{60}$.

It should be understood that each of the photoactive layers described herein may be active. That is, each of the layers may actively participate in the generation of charge carriers. Unlike those layers, some traditional multilayered devices comprise inactive layers that act as transport layers or optical spacers, but do not participate in the formation of charge carriers. For example, some traditional multilayered devices may comprise a photoactive cell, comprising two layers, sandwiched by two inactive layers that simply prevent contact between the layers of the photoactive cell and the electrode. In contrast, each of the organic photoactive layers described herein may participate in the productive absorption of light by forming a heterojunction at the interface of an adjoining layer. As described above, for example, excitons may be dissociated at both interfaces of the second photoactive layer (e.g., dual donor-acceptor layer) in a device comprising three organic layers.

Device 100 further comprises at least one organic seed layer 104 positioned between the cell and first electrode 102. In some embodiments, the seed layer is deposited directly on, and is in direct contact with, first electrode 102. The organic seed layer may also be in direct contact with the cell. For example, in some embodiments, organic seed layer 104 may be in direct contact with first electrode 102 and first photoactive layer 106.

It is believed that the organic seed layer may help to enhance the efficiency of certain photosensitive devices. For example, first photoactive layer 106 of device 100 may exhibit an increase in crystallinity when compared to devices that do not include an organic seed layer. Without being bound to any particular theory, it is believed that favorable (e.g., increased) crystalline properties may be imparted on one or more of the photoactive layers by depositing the first photoactive layer over the organic seed layer, wherein the photoactive layer is epitaxially controlled by the crystallite configuration of the seed layer. In some embodiments, there may be one or more intervening layers between organic seed layer 104 and first electrode 102, and/or between organic seed layer 104 and first photoactive layer 106. Suitable intervening layers may comprise one or more crystalline materials, such as those described herein for organic seed layer 104.

In some embodiments, the favorable crystalline characteristics of the photoactive layers may be achieved by sequentially depositing the layers of device 100, starting with first electrode 102 deposited on a substrate, followed by the deposition of at least one organic seed layer 104 and first photoactive layer 106. In some embodiments, the organic seed layer 104 may be deposited directly on first electrode 102, followed by the deposition of first photoactive layer 106 directly on organic seed layer 104. Suitable deposition techniques may include those discussed above, for example, OVPD and VTE. It is believed that the seed layer helps to control or alter the orientational growth direction or polymorph type of the overlying photoactive layers as they are deposited, such that arbitrary substrates such as glass or noncrystalline materials can be used.

In some embodiments, organic seed layer 104 may comprise a preferentially hole conducting organic material. In some embodiments, seed layer 104 may comprise a material selected from 1,4,5,8,9,11-hexaazatriphenylene-hexacarbonitrile (HAT-CN); 1,4,5,8,9,11-hexaazatriphenylene-hexacarboxamide 1,4,5,8,9,11-hexaazatriphenylene-1-hexacarboxylic acid; 1,4,5,8,9,11-hexaazatriphenylene-hexacarboxylic acid trisanhydride; tetracyanoquinonedimethane (TCNQ); 2,3,5,6-tetrafluoro-7,7,8,8,-tetracyano-quinonedimethane (F4-TCNQ); N,N'-dicyano-2,3,5,6-tetrafluoro-1,4-quinonediimine (F4DCNQI); N,N'-dicyan-2,5-dichloro-3,6-difluoro-1,4-quinonediimine (C12F2DCNQI); N,N'-dicyano-2,3,5,6,7,8-hexafluoro-1,4-naphtho-quinonediimine(F6DCNNOI); 1,4,5,8-tetrahydro-1,4,5,8-tetrathia-2,3,6,7-tetracyanoanthraquinone (CN4TTAQ); 2,2,7,7,-tetrafluoro-2,7-dihydro-1,3,6,8-tetraoxa-2,7-dibora 4,9,10,11,12-pentachloro-benzo[e]pyrene; 2-(6-dicyanomethylene-1,3,4,5,7,8-hexafluoro-6H-naphthalene-2-ylidene)malononitrile, and combinations thereof. In one embodiment, the material comprises HAT-CN.

Optionally, device 100 may further comprise blocking layer 112, such as an exciton blocking layer ("EBL"). Examples of EBLs are described in U.S. Pat. No. 6,451,415 to Forrest et al., which is incorporated herein by reference in its entirety for all purposes. Additional background explanation of EBLs may also be found in Peumans et al., "Efficient photon harvesting at high optical intensities in ultrathin organic double-heterostructure photovoltaic diodes," Applied Physics Letters 76, 2650-52 (2000), which is incorporated herein by reference in its entirety for all purposes. EBLs may work by reducing quenching by preventing excitons from migrating out of the donor and/or acceptor materials. Exemplary EBL materials may be selected from N,N'-diphenyl-N,N'-bis-alpha-napthylbenzidine (NPD), aluminum tris (8-hydroxyquinoline) (Alq3), carbazole bipheny (CBP), bathocuproine (BCP), and tris (acetylacetonato) ruthenium (III) (Ru(acac)$_3$). In one embodiment, blocking layer 112 comprises BCP.

In some embodiments, device 100 may further comprise one or more additional cells (e.g., photoactive regions). That is, in some embodiments, device 100 may comprise a "stack" of photoactive cells. Therefore, in some embodiments, device 100 may include at least a second photoactive region comprising another donor/dual acceptor-donor/acceptor heterojunction. In some embodiments, a first photoactive cell and a second photoactive cell may be incorporated into devices such as those shown in FIGS. 4A-E, as described further below. In some embodiments, the first and second cells may have different absorption characteristics.

Device 100 may further comprise transparent charge transfer layers, additional electrodes, or charge recombination zones. A charge transfer layer may be organic or inorganic, and may or may not be photoconductively active. A charge transfer layer is similar to an electrode, but does not have an electrical connection external to the device and delivers charge carriers from one subsection of an optoelectronic device to the adjacent subsection. A charge recombination zone is similar to a charge transfer layer, but allows for the recombination of electrons and holes between adjacent subsections of an optoelectronic device. A charge recombination zone may include semi-transparent metal or metal substitute recombination centers comprising nanoclusters, nanoparticles, and/or nanorods, as described for example in U.S. Pat. No. 6,657,378 to Forrest et al.; Published U.S. Patent Application 2006-0032529 A1 entitled "Organic Photosensitive Devices" by Rand et al., filed Aug. 11, 2004; and U.S. Pat. No. 7,375,370 entitled "Stacked Organic Photosensitive Devices" by Forrest et al., filed Nov. 3, 2004; each incorporated herein by reference in its entirety for all purposes. A charge recombination zone may or may not include a transparent matrix layer in which the recombination centers are embedded. A charge transfer layer, electrode, or charge recombination zone may serve as a cathode and/or an anode of subsections of the optoelectronic device. An electrode or charge transfer layer may serve as a Schottky contact.

Figure 3:
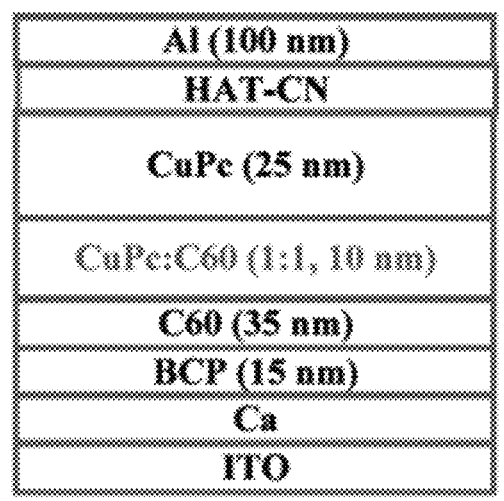
FIG. 3 is a schematic drawing of a structure, in cross-section, illustrating an exemplary inverted organic solar cell comprising a HAT-CN seed layer.

In addition to the device disclosed in FIG. 1, suitable devices comprising at least one organic seed layer may be constructed as an "inverted device." For example, FIG. 3 shows an example of an inverted device comprising a HAT-CN seed layer positioned between an Al or Ag anode and a CuPc photoactive layer. A BCP blocking layer is positioned between the photoactive region and a compound ITO/metal cathode.

Figures 4A, 4B:
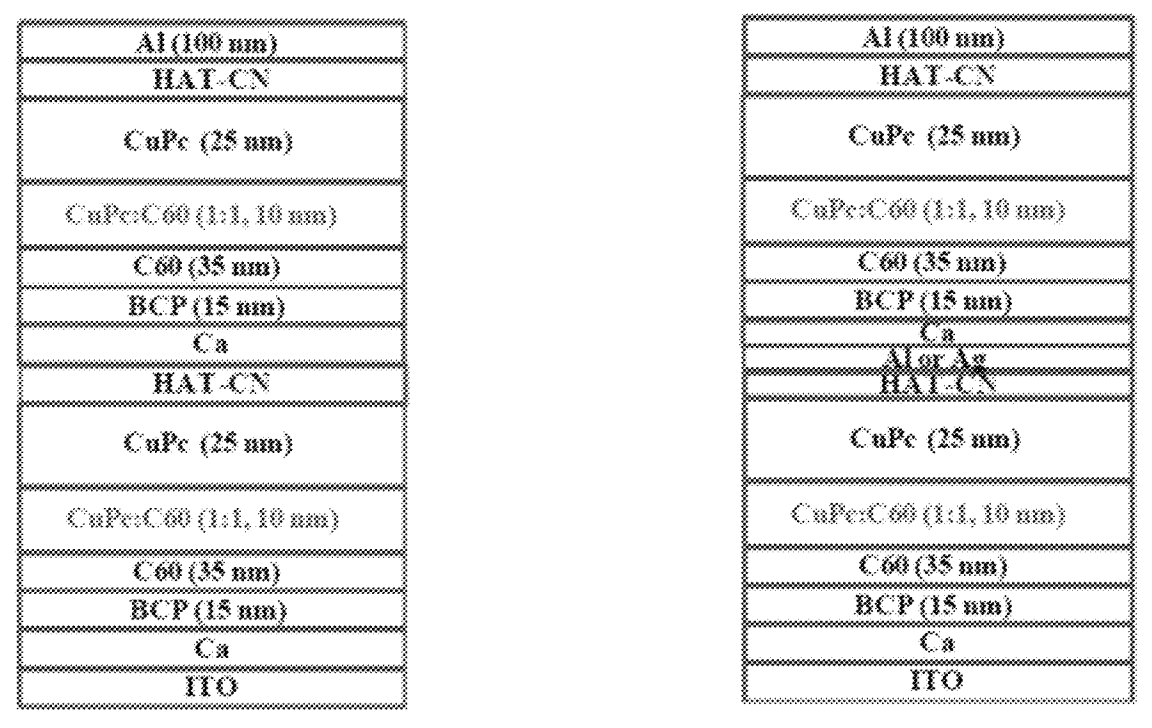

In other embodiments, suitable devices may include "tandem" devices such as those illustrated in FIGS. 4A-E. In such devices, two or more photoactive cells may be stacked electrically in a series with intervening conductive regions. The intervening conductive region(s) may be a charge recombination zones or may be charge transfer layers. As a recombination zone, the region may comprise recombination centers with or without a transparent matrix layer. If there is no matrix layer, the arrangement of material forming the zone may not be continuous across the region. The second photoactive cell may comprise a single donor/acceptor heterojunction, or may comprise a donor/dual acceptor-donor/acceptor heterojunction different from or similar to those described above for device 100. Optionally, the tandem device may comprise one or more smoothing layers and/or blocking layers such as those described above. FIGS. 4A and B represent examples of inverted tandem devices. Is should be understood that the devices of FIGS. 4A-E are purely exemplary and are in no way limiting.

In each of the devices described herein, layers may be omitted, such as the exciton blocking layers. Other layers may be added, such as reflective layers or additional photoactive regions. The order of layers may be altered or inverted. A concentrator or trapping configuration may be employed to increase efficiency, as disclosed, for example in U.S. Pat. No. 6,333,458 to Forrest et al. and U.S. Pat. No. 6,440,769 to Peumans et al., which are incorporated herein by reference in their entireties for all purposes. Coatings may be used to focus optical energy into desired regions of a device, as disclosed, for example in U.S. Pat. No. 7,196,835 entitled "A periodic dielectric multilayer stack" by Peumans et al., filed Jun. 1, 2004, which is incorporated herein by reference in its entirety for all purposes. In the tandem devices, transparent insulative layers may be formed between cells, with the electrical connection between the cells being provided via electrodes. Also in the tandem devices, one or more of the photoactive regions may be a Schottky-barrier heterojunction instead of a donor-acceptor heterojunction. Arrangements other than those specifically described may be used.

Figure 5A:
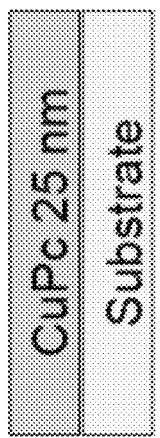
FIG. 5A is a schematic drawing of a structure, in cross-section, illustrating a structure comprising a CuPc layer grown on a substrate by vacuum thermal evaporation (VTE).
Figure 5B:
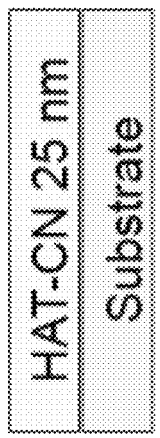
FIG. 5B is a schematic drawing of a structure, in cross-section, illustrating a structure comprising a HAT-CN layer grown on a substrate by VTE.
Figure 5C:
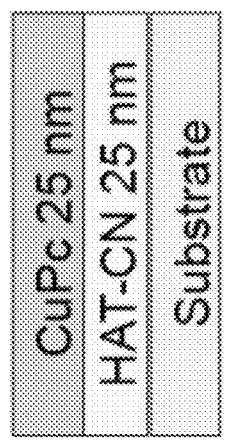
FIG. 5C is a schematic drawing of a structure, in cross-section, illustrating a structure comprising a CuPc and HAT-CN layers grown on a substrate by VTE.

In other embodiments, suitable devices may include one or more CuPc and/or HAT-CN layers, for example those grown on a substrate by vacuum thermal evaporation (VTE), such as those illustrated in FIGS. 5A-C. For example, in one embodiment, the CuPc layer may be in direct contact with the substrate. FIG. 5A is a schematic drawing of a structure, in cross-section, illustrating a structure comprising a CuPc layer grown on a substrate by vacuum thermal evaporation (VTE).

In another embodiment, a HAT-CN layer may be grown on a substrate by VTE. FIG. 5B is a schematic drawing of a structure, in cross-section, illustrating a structure comprising a HAT-CN layer grown on a substrate by VTE.

In yet another embodiment, both a CuPc layer and a HAT-CN layer may be grown on a substrate. FIG. 5C is a schematic drawing of a structure, in cross-section, illustrating a structure comprising a CuPc and HAT-CN layers grown on a substrate by VTE.

X-Ray Diffraction Data

Figure 6:
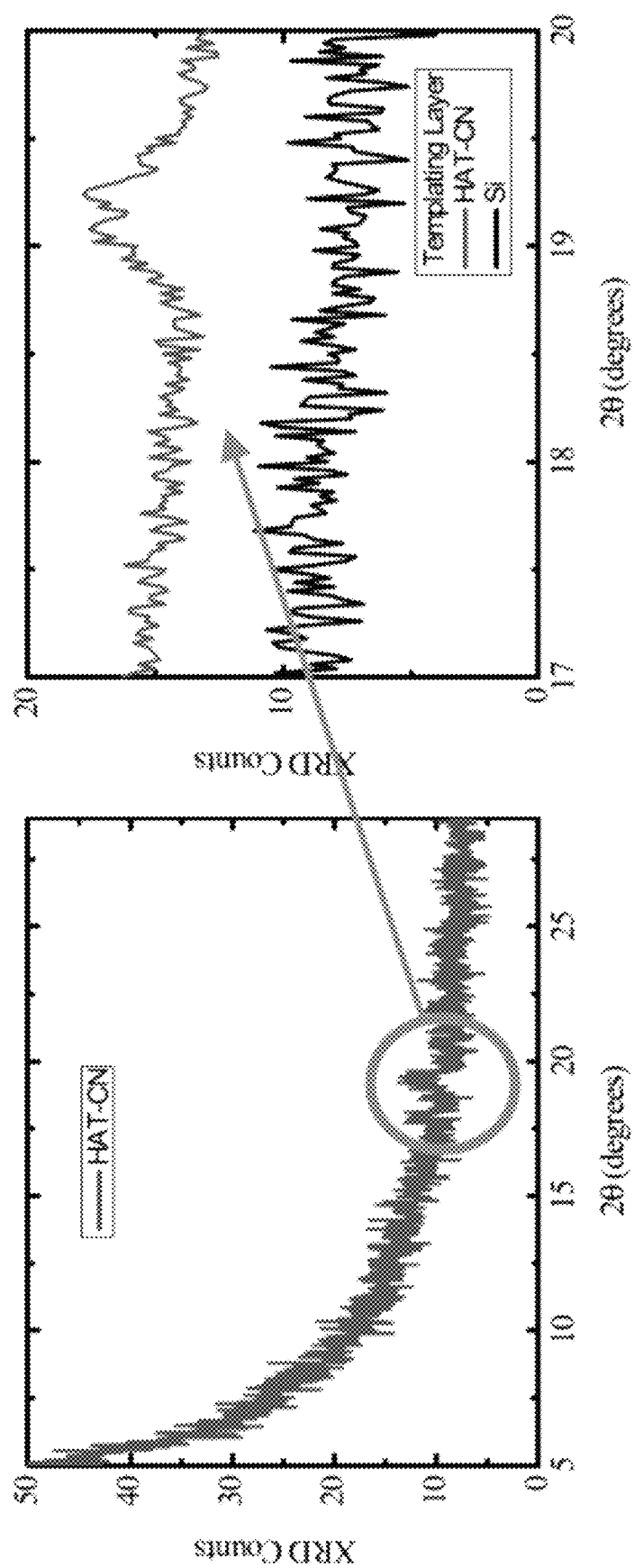
FIG. 6 shows the x-ray diffraction (XRD) properties of the HAT-CN layer in FIG. 5B grown on a Si substrate.

FIG. 6 shows the x-ray diffraction (XRD) properties of the HAT-CN layer in FIG. 5B grown on a Si substrate. As shown in FIG. 6, there is a clear distinction between the HAT-CN layer and the underlying Si substrate.

Figure 7B:
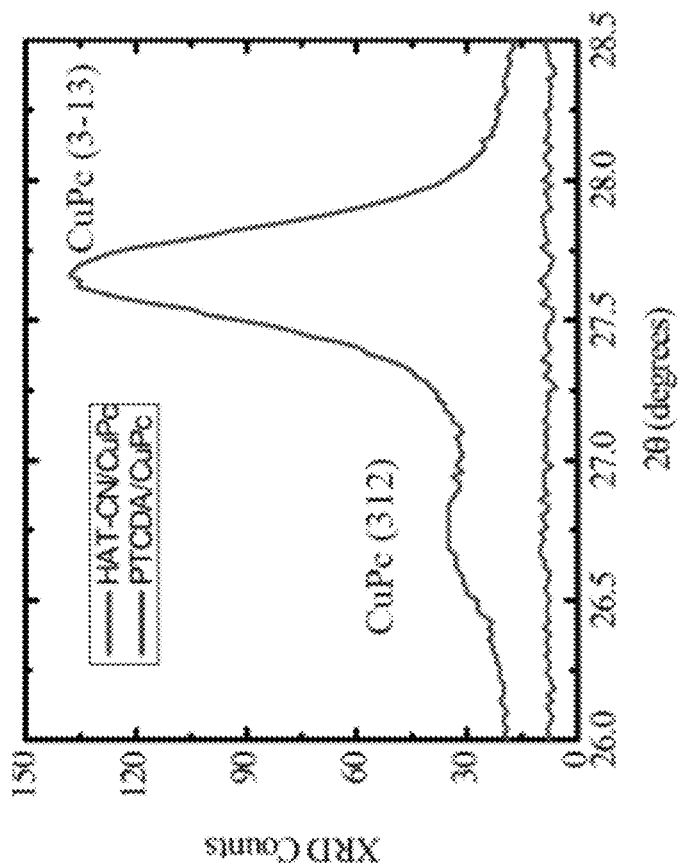
FIGS. 7A-B show the XRD properties of the HAT-CN and CuPc layer combinations in FIGS. 5A-C, as well as a PTCDA/CuPc combination, grown on a Si substrate.
Figure 7A:
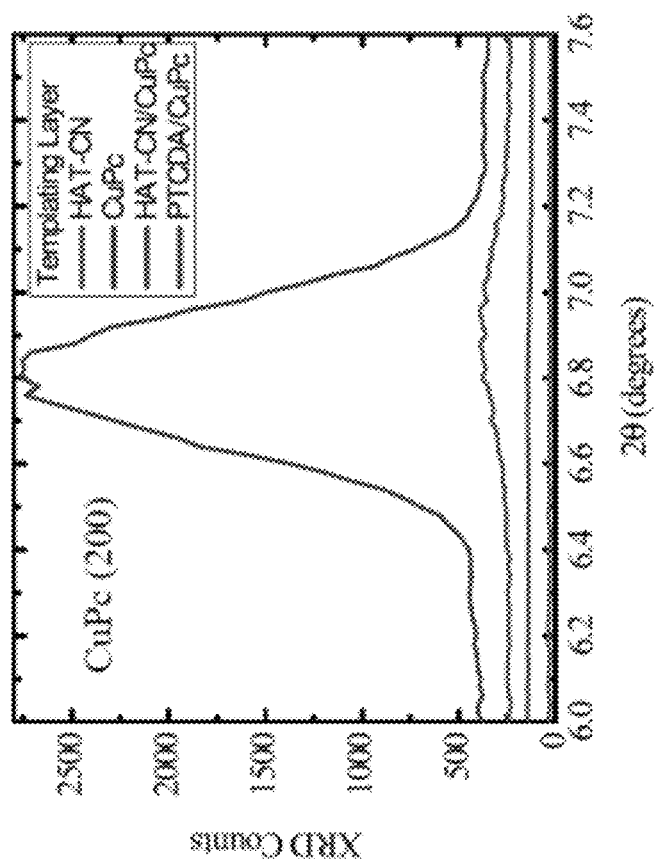

The same is true for the XRD patterns on the embodiments comprising CuPc, alone or in combination with a HAT-CN layer. For example, FIGS. 7A-B show the XRD properties of the HAT-CN and CuPc layer combinations in FIGS. 5A-C, as well as a PTCDA/CuPc combination, grown on a Si substrate.

Figure 8B:
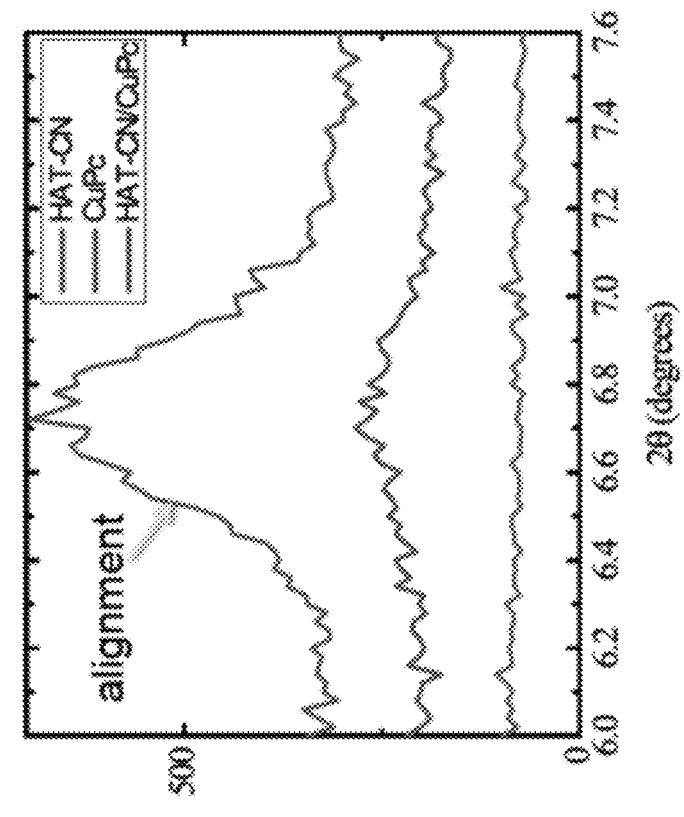
FIGS. 8A-C show the XRD properties of the HAT-CN and CuPc layer combinations in FIGS. 5A-C grown on an ITO substrate.
Figure 8A:
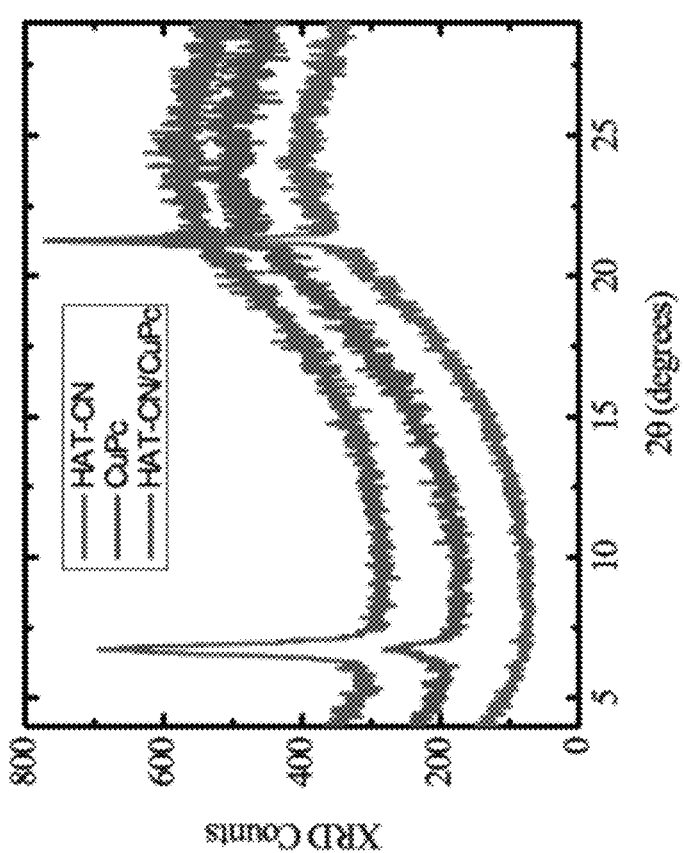
Figure 8C:
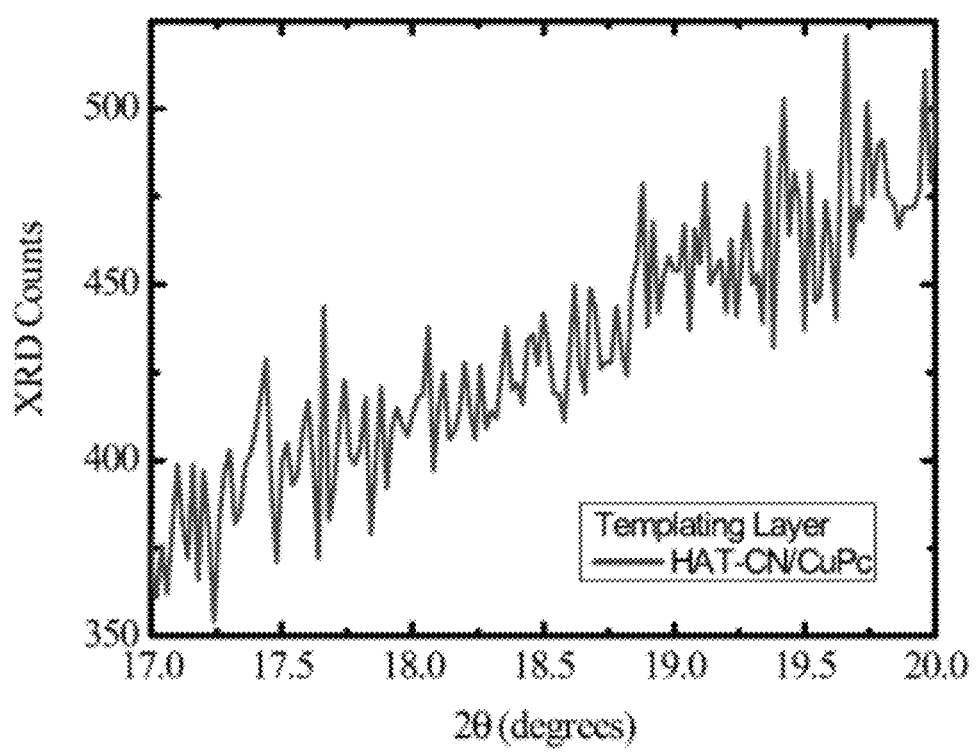

In addition, FIGS. 8A-C show the XRD properties of the HAT-CN and CuPc layer combinations in FIGS. 5A-C grown on ITO substrate.

EXAMPLES

Figure 9:
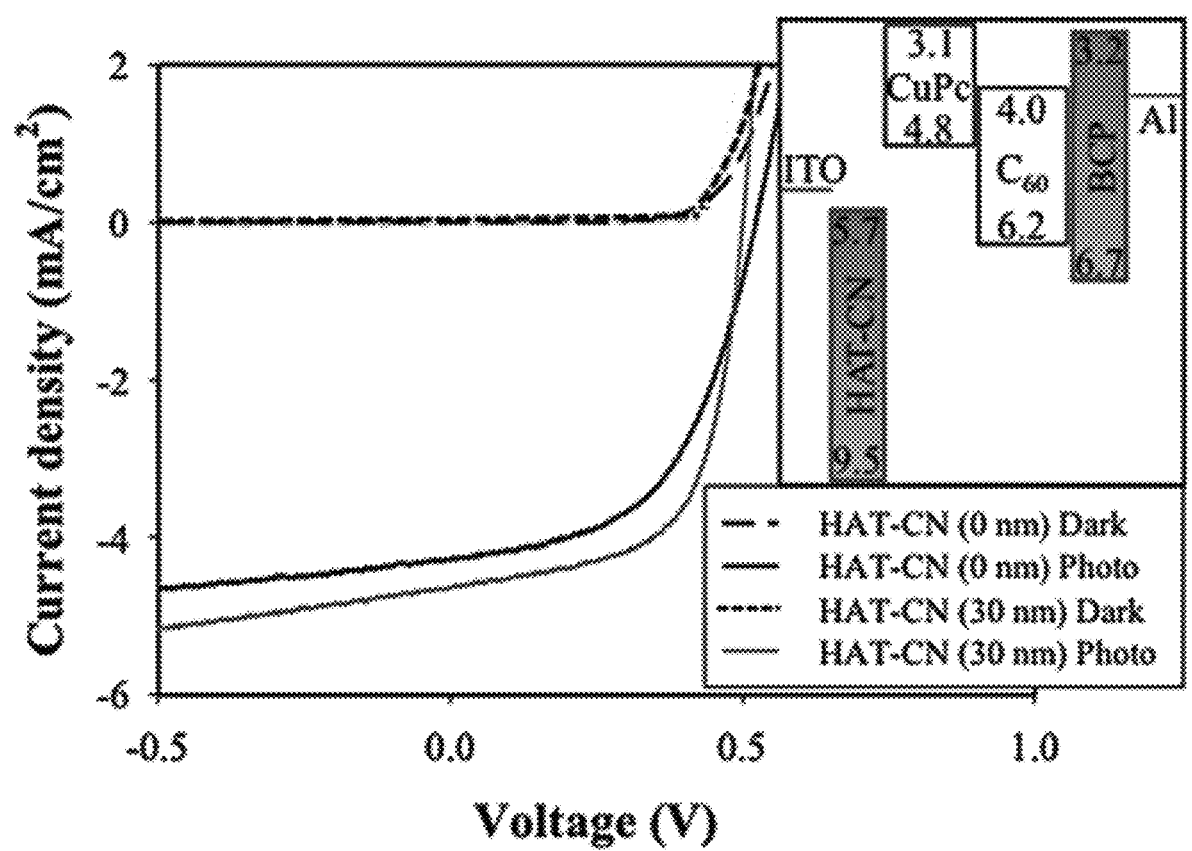
FIG. 9 is a graph showing current density-voltage characteristics of CuPc:C60 organic solar cells with and without a HAT-CN buffer layer under 1 sun (100 mW/cm2) AM1.5 G illumination ("Photo" in legend) and in the dark. Inset: Proposed equilibrium energy level diagram showing the relative positions of the frontier orbitals in the ITO/HAT-CN/CuPc/C60/BCP/Al solar cell. Numbers shown are the energies (in eV) of the orbitals relative to the vacuum level. No interfacial energy level shifts are assumed, nor any band bending is shown. Energies taken from the references.

Two OPVs, one with and one without the HAT-CN buffer layer were fabricated as described above. FIG. 9 shows the dark current density (JD)-voltage and photocurrent density (JPH)-voltage characteristics of the corresponding OPVs. The dark current density of the OPV at V>0 was increased using the HAT-CN buffer layer, while JD at V<0 was unchanged. The increase under positive bias results from the improved hole extraction due to reduced CuPc resistance as a result of its improved order (see below). Under 1 sun, AM1.5 G illumination, Jsc is enhanced from $4.2\pm0.06$ mA/cm$^2$ to $4.6\pm0.05$ mA/cm$^2$ using the HAT-CN templating layer, but even more significantly, ff was increased from $50\%\pm2\%$ to $62\%\pm1\%$. The PCE was improved from $1.1\%\pm0.1\%$ to $1.4\%\pm0.1\%$ using the HAT-CN as a templating buffer layer as a result of the increase of Jsc and ff without any significant change in Voc.

Detailed data for the HAT-CN modified OPVs are summarized in Table I. Fill Factor (ff) is generally determined by a combination of the series and shunt resistances of the OPVs. It is apparent from the slope of the forward biased JPH-V characteristics that a decrease in series resistance is responsible for the increased ff Specifically, the areal series resistance calculated from the JD-V characteristics was reduced from $33\pm7$ $\Omega$-cm$^2$ to $2.5\pm0.2$ $\Omega$-cm$^2$ when using the charge transporting HAT-CN template.

TABLE 1

Performance of CuPc:C$_{60}$ solar cells without (control) and with a HAT-CN template layer

|  | Control | 30 nm HAT-CN |
|---|---|---|
| J$_{sc}$ (mA/cm$^2$) | 4.2 ± 0.1 | 4.6 ± 0.1 |
| V$_{oc}$ (V) | 0.51 ± 0.02 | 0.50 ± 0.01 |
| Fill factor (%) | 50 ± 2 | 62 ± 1 |
| Efficiency (%) | 1.1 ± 0.1 | 1.4 ± 0.1 |
| Series resistance ($\Omega \cdot$ cm$^2$) | 33 ± 7 | 2.5 ± 0.2 |

Figure 10:
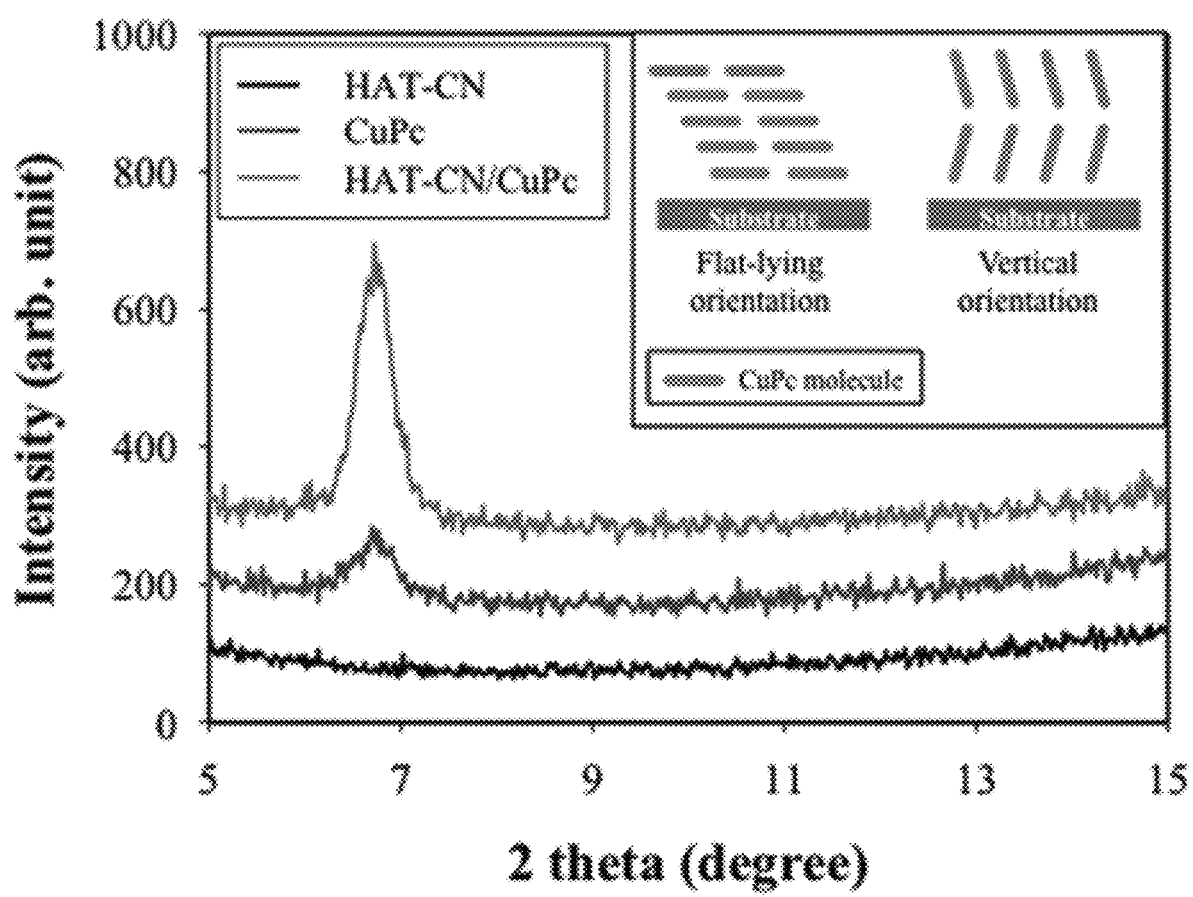
FIG. 10 shows X-ray diffraction patterns of the CuPc, HAT-CN and HAT-CN/CuPc films grown on an indium tin oxide substrate. The thicknesses of the CuPc and HAT-CN layers were 25 nm and 30 nm, respectively. Inset shows the CuPc crystal stacking habits in the flat-lying (left) and vertical standing (right) stacking directions. The vertical standing stacks remain ordered over several tens of nanometers of film growth, as indicated by the strength of the x-ray peaks.

To study the origin for the reduced series resistance, X-ray diffraction measurements of the CuPc film on ITO with and without a HAT-CN buffer layer template were performed. FIG. 10 shows the X-ray diffraction data of three samples: CuPc on ITO, HAT-CN on ITO and CuPc on HATCN/ITO. The HAT-CN on ITO did not show any observable diffraction peak due to the very thin layer used, while the CuPc on ITO exhibited a weak peak at 2θ=6.7° corresponding to the (200) diffraction of the a-phase of CuPc. The CuPc diffraction intensity was significantly enhanced for the ITO/HAT-CN/CuPc film, indicating that HAT-CN plays the role of template that induces the crystallization of the overlying film.

Figure 11:
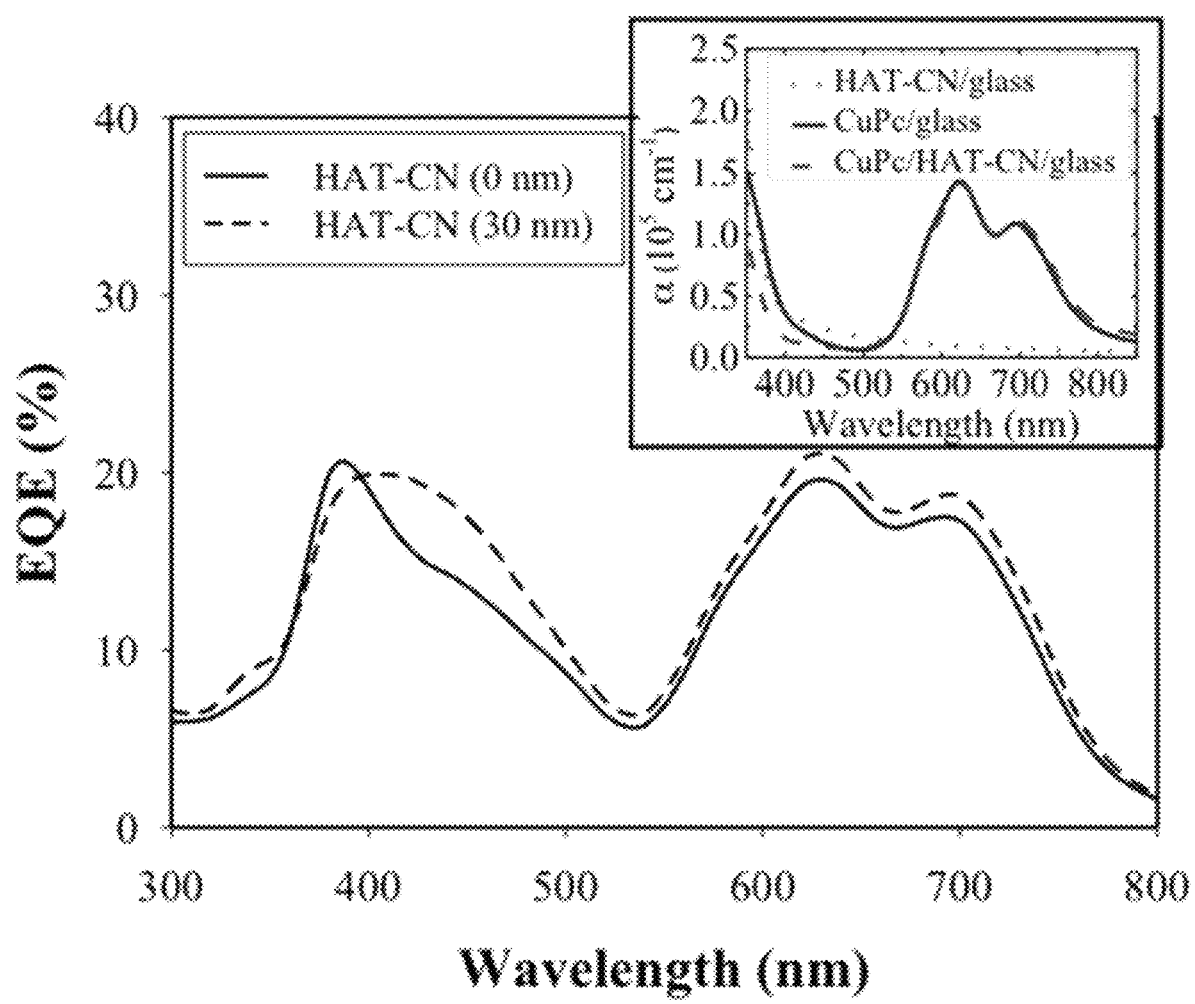
FIG. 11 is a graph showing external quantum efficiency vs. wavelength of CuPc:$C_{60}$ solar cells with (dashed line) and without (solid line) a HAT-CN buffer layer. Inset: Absorption spectra of a glass substrate/HAT-CN/CuPc/CuPc:$C_{60}$ structure without and with a 30 nm thick HAT-CN template layer.

Since the CuPc diffraction peak position was unchanged with the addition of the HAT-CN and only the peak intensity increased, we infer that larger, oriented CuPc domains were formed without changing the crystal orientation. The 2θ=6.7° peak has previously been attributed to the vertical alignment of the CuPc molecules on the substrate surface, as shown in FIG. 10, inset. We conclude, therefore, that the reduced series resistance of the OPV with the HAT-CN buffer layer is partially due to the crystalline morphology of the CuPc leading to a higher hole mobility. Extensive crystallization of the CuPc layer was induced by the HAT-CN template, thereby decreasing the resistance between the active layer and the ITO electrode. Another reason for the reduced series resistance is the decrease in contact resistance between the ITO and HAT-CN as inferred from the energy level diagram in FIG. 1, and as previously reported. The external quantum efficiency (EQE) of the OPV with and without the HAT-CN template is shown in FIG. 11. The EQE increased slightly over the entire wavelength range studied, from $\lambda=300$ nm to 800 nm, by inserting the HAT-CN layer between ITO and CuPc. On the other hand, the absorption spectrum of the active layer was unchanged by the introduction of HAT-CN, as shown in FIG. 11, inset, indicating that the increase of the EQE is due to the increase of the photocurrent arising from the improved crystalline order.

Other than in the examples, or where otherwise indicated, all numbers expressing quantities of ingredients, reaction conditions, analytical measurements, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present disclosure. At the very least, and not as an attempt to limit the application of the doctrine of equivalents to the scope of the claims, each numerical parameter should be construed in light of the number of significant digits and ordinary rounding approaches.

Notwithstanding that the numerical ranges and parameters setting forth the broad scope of the disclosure are approximations, unless otherwise indicated the numerical values set forth in the specific examples are reported as precisely as possible. Any numerical value, however, inherently contains certain errors necessarily resulting from the standard deviation found in their respective testing measurements.

Other embodiments of the devices and methods described herein will be apparent to those skilled in the art from consideration of the specification and practice. It is intended that the specification and examples be considered as exemplary only, with the true scope of the devices and methods described being indicated by the claims.

What is claimed is:

1. An organic solar cell comprising:
   a first electrode;
   a second electrode;
   at least one crystalline organic seed layer; and
   at least one photoactive region of the organic solar cell comprising a first organic photosensitive layer epitaxially deposited on the at least one crystalline organic seed layer, wherein the at least one crystalline organic seed layer induces crystallization in the epitaxially deposited first organic photosensitive layer, and a second organic photosensitive layer,
   wherein the at least one crystalline organic seed layer comprises 1,4,5,8,9,11-hexaazatriphenylene-hexacarbonitrile (HAT-CN); 1,4,5,8,9,11-hexaazatriphenylene-hexacarboxamide; 1,4,5,8,9,11-hexaazatriphenylene-hexacarboxylic acid; 1,4,5,8,9,11-hexaazatriphenylene-hexacarboxylic acid trisanhydride; or a combination thereof; and
   wherein the induced crystallization results in at least the first organic photosensitive layer exhibiting an increase in crystallinity when compared to an organic photosensitive layer in the same organic solar cell deposited without the at least one crystalline organic seed layer.

2. The organic solar cell of claim 1, wherein the at least one crystalline organic seed layer is positioned between the first electrode and the at least one photoactive region.

3. The organic solar cell of claim 2, wherein the at least one crystalline organic seed layer is positioned directly on the first electrode.

4. The organic solar cell of claim 3, wherein the first organic photosensitive layer is positioned directly on the at least one crystalline organic seed layer.

5. The organic solar cell of claim 1, wherein the second organic photosensitive layer is positioned between the second electrode and the first organic photosensitive layer.

6. The organic solar cell of claim 1, wherein the at least one photoactive region further comprises a third organic photosensitive layer.

7. The organic solar cell of claim 6, wherein the third organic photosensitive layer is positioned between the first organic photosensitive layer and the second organic photosensitive layer.

8. The organic solar cell of claim 1, wherein the first organic photosensitive layer comprises a material selected from subphthalocyanonine chloride (SubPc), copper phthalocyanine (CuPc), C60 and C70 fullerenes, chloro-aluminum phthalocyanine (ClAlPc), squaraine (SQ), poly(3-hexylthiophene) (P3HT), and combinations thereof.

9. The organic solar cell of claim 1, wherein the second organic photosensitive layer comprises a material selected from C60 and C70 fullerenes, 3,4,9,10-perylenetetracarboxylic dianhydride (PTCDA), perfluorinated copper phthalocyanine (F16-CuPc), and combinations thereof.

10. The organic solar cell device of claim 6, wherein the third organic photosensitive layer comprises a material selected from subphthalocyanonine chloride (SubPc), copper phthalocyanine (CuPc), C60 and C70 fullerenes, chloro-aluminum phthalocyanine (ClAlPc), squaraine (SQ), poly (3-hexylthiophene) (P3HT), 3,4,9,10-perylenetetracarboxylic dianhydride (PTCDA), perfluorinated copper phthalocyanine (F16-CuPc), and combinations thereof.

11. The organic solar cell of claim 1, wherein the first electrode comprises at least one metal oxide material chosen from zinc oxide, gallium indium oxide, indium gallium zinc oxide, indium tin oxide, titanium oxide, magnesium oxide, gallium indium tin oxide, tungsten oxide, zinc indium oxide, and zinc indium tin oxide.

12. The organic solar cell of claim 11, wherein the first electrode comprises a compound ITO/metal electrode, wherein said metal is selected from Ca, LiF/Al, and Mg:Ag.

13. The organic solar cell of claim 1, wherein the second electrode comprises a material selected from steel, Ni, Ag, Al, Mg, In, and mixtures or alloys thereof.

14. The organic solar cell of claim 1, further comprising at least one blocking layer.

15. The organic solar cell of claim 14, wherein the at least one blocking layer is positioned between the at least one photoactive region and the second electrode.

16. The organic solar cell of claim 14, wherein the at least one blocking layer comprises a material selected from N,N'-diphenyl-N,N'-bis-alpha-napthylbenzidine, aluminum tris (8-hydroxyquinoline), carbazole biphenyl, bathocuproine, and tris(acetylacetonato) ruthenium (III).

17. The organic solar cell of claim 1, wherein said organic solar cell is an inverted solar cell.

18. The organic solar cell of claim 1, wherein the at least one crystalline organic seed layer is positioned between the second electrode and the at least one photoactive region.

19. The organic solar cell of claim 1, further comprising at least one second photoactive region, at least one second crystalline organic seed layer, and a third electrode.

20. The organic solar cell of claim 19, wherein said organic solar cell is a tandem solar cell.

21. The organic solar cell of claim 1, wherein said at least one crystalline organic seed layer has a thickness to achieve one or more of the following characteristics when compared to the organic photosensitive layer in the same organic solar cell deposited without the at least one crystalline organic seed layer:

increased open circuit voltage ($V_{oc}$);
increased short circuit current ($I_{sc}$); and
increased fill factor (ff).

22. The organic solar cell of claim 21, wherein said at least one crystalline organic seed layer has a thickness ranging from 5 to 50 nm.

\* \* \* \* \*